US011422582B2

(12) United States Patent
Choi et al.

(10) Patent No.: US 11,422,582 B2
(45) Date of Patent: Aug. 23, 2022

(54) LOW POWER REFERENCE VOLTAGE GENERATING CIRCUIT

(71) Applicants: SK hynix Inc., Icheon (KR); Korea Advanced Institute of Science and Technology (KAIST), Daejeon (KR)

(72) Inventors: Sungwon Choi, Daegu (KR); Gyu-hyeong Cho, Daejeon (KR); Youngsub Yuk, Yongin (KR)

(73) Assignees: SK hynix Inc., Icheon (KR); KOREA ADVANCED INSTITUTE OF SCIENCE AND TECHNOLOGY (KAIST), Daejeon (KR)

( * ) Notice: Subject to any disclaimer, the term of this patent is extended or adjusted under 35 U.S.C. 154(b) by 137 days.

(21) Appl. No.: 16/543,314

(22) Filed: Aug. 16, 2019

(65) Prior Publication Data
US 2020/0209906 A1 Jul. 2, 2020

(30) Foreign Application Priority Data
Dec. 31, 2018 (KR) .................. 10-2018-0173690

(51) Int. Cl.
*G05F 3/26* (2006.01)
*G05F 3/24* (2006.01)
*H03F 3/00* (2006.01)
*H03F 3/45* (2006.01)

(52) U.S. Cl.
CPC .............. *G05F 3/262* (2013.01); *G05F 3/242* (2013.01); *H03F 3/005* (2013.01); *H03F 3/45192* (2013.01)

(58) Field of Classification Search
CPC ... G05F 3/262; G05F 3/26; G05F 3/24; G05F 3/242; G05F 3/245; G05F 3/247;
(Continued)

(56) References Cited

U.S. PATENT DOCUMENTS 6,696,884 B1 * 2/2004 Seven .................. G05F 3/08
327/554
9,319,033 B1 * 4/2016 Jin .................. H03K 4/502
(Continued)

OTHER PUBLICATIONS

Chen, et al., "A 2.98nW bandgap voltage reference using a self-tuning low leakage sample and hold", 2012 Symposium on VLSI Circuits (VLSIC).
(Continued)

*Primary Examiner* — Thienvu V Tran
*Assistant Examiner* — Shahzeb K Ahmad

(57) ABSTRACT

A reference voltage generating circuit includes a bandgap reference (BGR) circuit configured to output an active reference voltage at a first node according to a sample signal; a first charging circuit configured to charge a first capacitor using the active reference voltage according to the sample signal; a second charging circuit configured to charge a second capacitor using the active reference voltage according to the sample signal; and a comparing circuit configured to compare a voltage difference between a charge voltage of the first capacitor and a charge voltage of the second capacitor with a threshold value, wherein the sample signal is a pulse signal generated using an output of the comparing circuit and the charge voltage of the first capacitor is provided as a low power reference voltage in a low power operation mode.

22 Claims, 8 Drawing Sheets

(58) Field of Classification Search
CPC ......... G05F 1/46; G11C 27/024; G11C 5/145; G11C 5/147; H03K 5/159; H03K 17/06; H03F 3/005; H03F 3/45192
USPC ....................................................... 323/313
See application file for complete search history.

(56) References Cited

U.S. PATENT DOCUMENTS

| | | | |
|---|---|---|---|
| 9,342,084 B1 * | 5/2016 | Konecny | H03K 5/24 |
| 10,050,526 B2 | 8/2018 | Zanetta | |
| 10,348,283 B1 * | 7/2019 | Sonntag | H02M 3/1582 |
| 2012/0326695 A1 * | 12/2012 | Chen | G11C 11/4074 |
| | | | 323/313 |
| 2017/0199540 A1 * | 7/2017 | Tseng | G05F 3/30 |
| 2018/0151242 A1 * | 5/2018 | Vilas Boas | H03K 5/159 |

OTHER PUBLICATIONS

Seok, et al., "A Portable 2-Transistor Picowatt Temperature-Compensated Voltage Reference Operating at 0.5 V", IEEE Journal of Solid-State Circuits, 012, October, vol. 47, No. 10, pp. 2534-2545.

Ge, et al., "A Single-Trim CMOS Bandgap Reference With a 3 sigma Inaccuracy of 0.15% From 40 C to 125 C", IEEE Journal of Solid-State Circuits, Nov. 2011, vol. 46, No. 11, pp. 2693-2701.

Butzen, et al., "Leakage Current in Sub-Micrometer CMOS Gates", 2008.

* cited by examiner

LOW POWER REFERENCE VOLTAGE GENERATING CIRCUIT

CROSS-REFERENCE TO RELATED APPLICATION

The present application claims priority under 35 U.S.C. § 119(a) to Korean Patent Application No. 10-2018-0173690, filed on Dec. 31, 2018, which is incorporated herein by reference in its entirety.

BACKGROUND

1. Technical Field

Various embodiments may relate to a low power reference voltage generating circuit which is insensitive to PVT (Process, Voltage, and Temperature) variations.

2. Related Art

In general, most devices used in integrated circuits exhibit different characteristics depending on the temperature. Therefore, the circuit that generates the reference voltage also changes such characteristics, and the actual output voltage slightly differs, depending on the temperature, from the target reference voltage.

Such a change in the reference voltage may significantly hinder the stability of the operation of the integrated circuits, including a memory system. Therefore, a design considering various possibilities is required for stabilizing the reference voltage.

Such a change in reference voltage sensitively depends on process, voltage, and the like as well as on temperature change. A reference power supply capable of stably providing a constant reference voltage is required in a variety of situations.

A bandgap reference (BGR) circuit is widely used as a reference voltage generating circuit as it is less affected by process, voltage and temperature (PVT) variations than other designs.

An integrated circuit, such as a memory device, when operating in a normal mode generates a reference voltage using a BGR circuit which consumes higher current. Operating in the normal mode may include processing instructions such as reading or writing.

However, when the BGR circuit used in the normal mode is also used as it is when the integrated circuit is in a standby state in which no instruction is processed, the standby state power consumption may increase to a level not suitable for low power operation.

Further, when a separate BGR circuit for low power operation is used, there is a problem that the area of the entire integrated circuit is increased due to the additional circuit.

SUMMARY

In accordance with an embodiment of the present disclosure, a semiconductor device may include a bandgap reference (BGR) circuit configured to output an active reference voltage at a first node according to a sample signal; a first charging circuit configured to charge a first capacitor using the active reference voltage according to the sample signal; a second charging circuit configured to charge a second capacitor using the active reference voltage according to the sample signal; and a comparing circuit configured to compare a voltage difference between a charge voltage of the first capacitor and a charge voltage of the second capacitor with a threshold value, wherein the sample signal is a pulse signal generated using an output of the comparing circuit and the charge voltage of the first capacitor is provided as a low power reference voltage in a low power operation mode.

In accordance with an embodiment of the present disclosure, a semiconductor device may include a bandgap reference (BGR) circuit configured to output an active reference voltage at a first node according to a sample signal; a first charging circuit configured to charge a first capacitor using the active reference voltage according to the sample signal; a compensating circuit configured to keep a charge amount of the first capacitor constant, the compensating circuit including an amplifier receiving a charge voltage of the first capacitor and a comparison voltage; and a comparing circuit configured to compare a voltage difference between charge voltage of the first capacitor and the comparison voltage to a threshold value, wherein the sample signal is a pulse signal generated from an output of the comparing circuit and the charge voltage of the first capacitor is provided as a low power reference voltage in a low power operation mode.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

Figure 1:
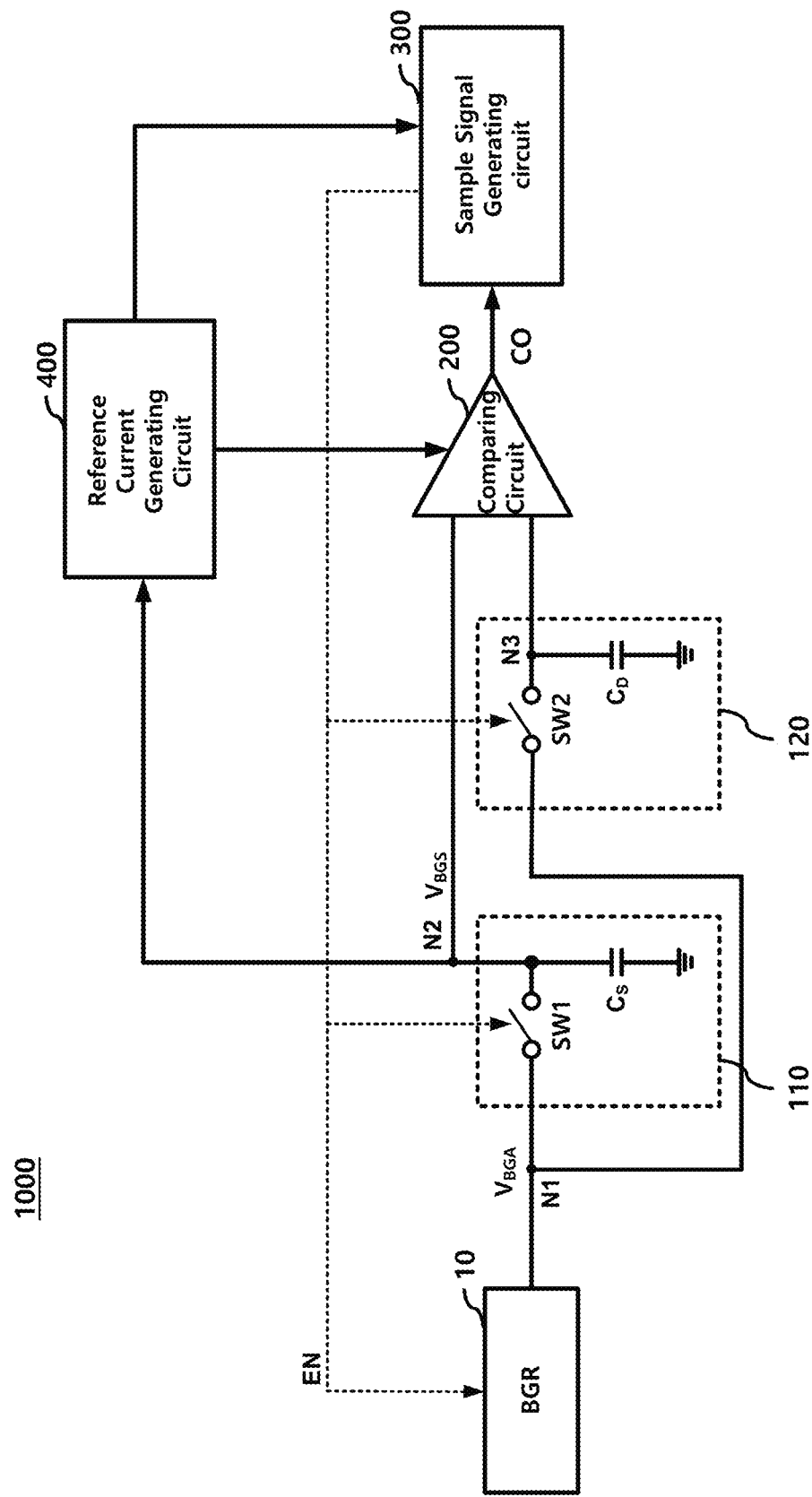
FIG. 1 illustrates a reference voltage generating circuit according to an embodiment.

FIG. 1 illustrates a reference voltage generating circuit 1000 according to an embodiment of the present disclosure.

The reference voltage generating circuit 1000 according to an embodiment of the present invention includes a bandgap reference (BGR) circuit 10, a first charging circuit 110, a second charging circuit 120, a comparing circuit 200 and a sample signal generating circuit 300.

In this embodiment, the BGR circuit 10 generates active reference voltage $V_{BGA}$ that is insensitive to PVT variation and the BGR circuit 10 is always activated in the normal mode. The BGR circuit 10 can be implemented using a known bandgap reference circuit, so a detailed description thereof will be omitted.

In this embodiment, in the normal mode the BGR circuit 10 is always turned on to output the active reference voltage $V_{BGA}$, and in the low power mode, the BGR circuit 10 is turned on intermittently according to the sample signal EN to output the active reference voltage $V_{BGA}$.

In the case where the BGR circuit 10 is included in a memory device and used, for example, when the memory device performs normal operations such as reading or writing, the BGR circuit 10 is always turned on to generate the active reference voltage $V_{BGA}$ when the normal operations are being performed.

Also, when the memory device performs a low power operation such as power down or deep power down, the BGR circuit 10 is turned on intermittently according to the sample signal EN to output the active reference voltage $V_{BGA}$.

The node at which the active reference voltage $V_{BGA}$ is output is referred to as a first node N1.

The first charging circuit 110 performs a charging operation using the active reference voltage $V_{BGA}$ according to the sample signal EN.

The first charging circuit 110 includes a first switch SW1 that is turned on in response to the sample signal EN and that is connected between the first node N1 and the second node N2. The first charging circuit 110 also includes a first capacitor $C_S$ connected between the second node N2 and the ground.

When the sample signal EN is activated, the BGR circuit 10 provides the active reference voltage $V_{BGA}$ and the first switch SW1 is turned on to charge the first capacitor $C_S$.

At the second node N2, low power reference voltage $V_{BGS}$ which is provided for low power operation is output.

The second charging circuit 120 performs a charging operation using the active reference voltage $V_{BGA}$ in accordance with the sample signal EN.

The second charging circuit 120 is turned on in accordance with the sample signal EN and includes a second switch SW2 connected between the first node N1 and a third node N3. The second charging circuit 120 also includes a second capacitor $C_D$ connected between the third node N3 and the ground.

When the sample signal EN is activated, the BGR circuit 10 provides the active reference voltage $V_{BGA}$ and the second switch SW2 is turned on to charge the second capacitor $C_D$.

The low power reference voltage $V_{BGS}$ varies when charge stored in the first capacitor $C_S$ supplying the low power reference voltage $V_{BGS}$ decreases or increases for some reason while the first switch SW1 is turned off.

In general, the voltage of the second node N2 can be monitored by comparing the voltage of the second node N2 with another reference voltage.

However, in the related arts, in order to generate another reference voltage, a separate bandgap reference circuit must be used. Therefore, in the related arts there is a problem that the area of the circuit is increased and the power consumption is increased because the separate bandgap reference circuit should be turned on at all times.

Instead, the present embodiment includes the second charging circuit 120 including a second capacitor $C_D$ having a smaller size than the first capacitor $C_S$ in order to detect a change in the voltage charged in the first capacitor $C_S$.

The second switch SW2 is turned on and off by the sample signal EN together with the first switch SW1.

In this embodiment, the capacitance of the second capacitor $C_D$ has 1/100 of the capacitance of the first capacitor $C_S$.

The second capacitor $C_D$ is located adjacent to the first capacitor $C_S$ and experiences variation in charge in a similar direction and magnitude to those of the first capacitor $C_S$.

Because the capacitance of the second capacitor $C_D$ is smaller than that of the first capacitor $C_S$, for any given change in charge to both capacitors $C_D$ and $C_S$, the voltage change of the third node N3 is larger than the voltage change of the second node N2.

For example, when charge is leaked from the first capacitor $C_S$, charge leakage occurs also in the second capacitor $C_D$, and the voltage of the second node N2 decreases with a larger slope than that of the voltage of the first node N1.

Conversely, when charges are introduced into the first capacitor $C_S$, charges are also introduced into the second capacitor $C_D$, and the voltage of the second node N2 increases with a larger slope than that of the voltage of the first node N1.

Thus, in this embodiment, the voltage change of the first capacitor $C_S$ is monitored by detecting the voltage difference between the first capacitor $C_S$ and the second capacitor $C_D$.

The comparing circuit 200 outputs a comparison signal CO that is activated when a magnitude of a voltage difference between the second node N2 and the third node N3 exceeds a predetermined threshold value and is inactivated otherwise. That is, the comparison signal CO is activated both when the voltage of the second node N2 is greater than the voltage of the third node N3 by more than the predetermined threshold value, and when the voltage of the second node N2 is less than the voltage of the third node N3 by more than the predetermined threshold value.

As described above, the voltage of the second node N2 and the voltage of the third node N3 decrease when charge leakage occurs in the first capacitor $C_S$, and increase when charge injection occurs in the capacitor $C_S$.

Accordingly, in order to monitor both of them, the comparing circuit 200 of this embodiment needs to detect whether the difference between the two inputs is greater than the threshold value.

Figure 2:
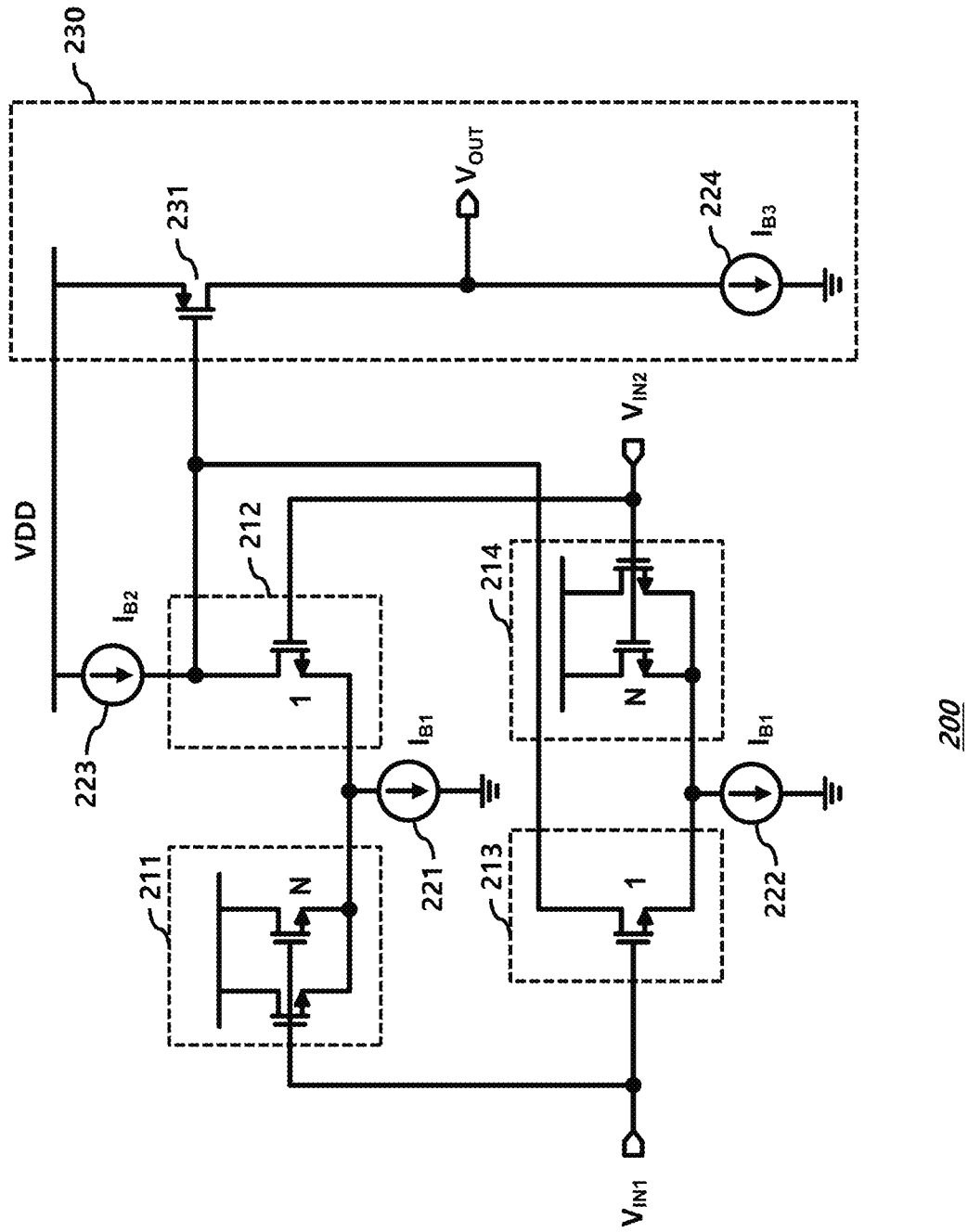
FIG. 2 illustrates a comparing circuit according to an embodiment.

FIG. 2 illustrates a comparing circuit 200 according to an embodiment of the present disclosure.

This embodiment includes two pairs of input transistors: a first pair including a first input transistor 211 and a second input transistor 212, and a second pair including a third input transistor 213 and a fourth input transistor 214.

The first input transistor 211 and the second input transistor 212 are NMOS transistors whose sources are commonly coupled to the first current source 221 and for which the ratio of respective sizes is N:1, where a size of a MOS transistor is represented by a ratio between channel width and channel length (W/L) and N is a number larger than 1.

The third input transistor 213 and the fourth input transistor 214 are NMOS transistors whose sources are commonly coupled to the second current source 222, and for which the ratio of respective sizes is also 1:N. In an embodiment, the first current source 221 and the second current source 222 each produce a current equal to a first predetermined current $I_{B1}$.

A first input signal $V_{IN1}$ is applied to the gates of the first input transistor 211 and the third input transistor 213. A second input signal $V_{IN2}$ is applied to the gates of the second input transistor 212 and the fourth input transistor 214. The first input signal $V_{IN1}$ may be from the second node N2 in FIG. 1, and the second input signal $V_{IN2}$ may be from the third node N3 in FIG. 1.

The drains of the second input transistor 212 and the third input transistor 213 are coupled in common to the third current source 223.

The output circuit 230 of the comparing circuit 200 includes a PMOS transistor 231 and a fourth current source 224. The output voltage $V_{OUT}$ is output from the drain of the PMOS transistor 231.

The gate of the PMOS transistor 231 is commonly coupled to the drain of the second input transistor 212 and the drain of the third input transistor 213.

In FIG. 2, if the two input voltages $V_{IN1}$ and $V_{IN2}$ are the same, current flowing through the first and second input transistors 211 and 212 may be determined according to the ratio of the sizes of the input transistors 211 and 212, and a sum of the currents corresponds to the first predetermined current $I_{B1}$ of the first current source 221.

Also, current flowing through the third and fourth input transistors 213 and 214 may be determined according to the ratio of the sizes of the input transistors 213 and 214, and a sum of the currents corresponds to the first predetermined current $I_{B1}$ of the second current source 222.

The output voltage $V_{OUT}$ of the comparing circuit 200 is determined according to the PMOS transistor 231 and the current $I_{B3}$ provided by the fourth current source 224.

In this embodiment, the current provided by each of the current sources is determined such that the output voltage $V_{OUT}$ be at a low level when the two input voltages $V_{IN1}$ and $V_{IN2}$ are equal to each other.

For example, when charging operation of the first capacitor $C_S$ and the second capacitor $C_D$ is completed, the two input voltages $V_{IN1}$ and $V_{IN2}$ are the same as the active reference voltage $V_{BGA}$ and the output voltage $V_{OUT}$ is at a low level.

When the second predetermined current $I_{B2}$ of the third current source 223 is larger than the sum of the current flowing through the second input transistor 212 and the third input transistor 213 as shown in the following Equation 1, the voltage of the gate of the PMOS transistor 231 is fixed to the power supply voltage, turning the PMOS transistor 231 off, and accordingly the output voltage $V_{OUT}$ will be set to a low level.

$$I_{B2} > \left( \frac{1}{N+1} I_{B1} + \frac{1}{N+1} I_{B1} \right) \quad \text{[Equation 1]}$$

When the first input voltage $V_{IN1}$ becomes larger than the second input voltage $V_{IN2}$ and difference therebetween exceeds the threshold value, the second input transistor 212 and the fourth input transistor 214 are substantially turned off, and the first predetermined current $I_{B1}$ flows through each of the first input transistor 211 and the third input transistor 213.

At this time, if the magnitude of the second predetermined current $I_{B2}$ of the third current source 223 is set smaller than the magnitude of the first predetermined current $I_{B1}$ of the second current source 222 that is flowing through the third input transistor 213, the gate voltage of the PMOS transistor 231 falls to a low level and the output voltage $V_{OUT}$ rises to a high level.

The situation where the first input voltage $V_{IN1}$ becomes smaller than the second input voltage $V_{IN2}$ and difference therebetween exceeds the threshold value also operates similarly to the above, except that the first input transistor 211 and the third input transistor 213 are substantially turned off, and the first predetermined current $I_{B1}$ flows through each of the second input transistor 212 and the fourth input transistor 214. Then because the magnitude of the second predetermined current $I_{B2}$ of the third current source 223 is set smaller than the magnitude of the first predetermined current $I_{B1}$ of the first current source 221 that is flowing through the second input transistor 212, the output voltage $V_{OUT}$ also rises to a high level.

The threshold value is determined by the ratio of sizes of the two pairs of input transistors. Since the threshold value is not affected by the power supply voltage VDD in this manner, the comparing circuit is less affected by the variation of the power supply voltage.

Returning to FIG. 1, the sample signal generating circuit 300 generates the sample signal EN from the comparison signal CO output from the comparing circuit 200.

Figure 3A:
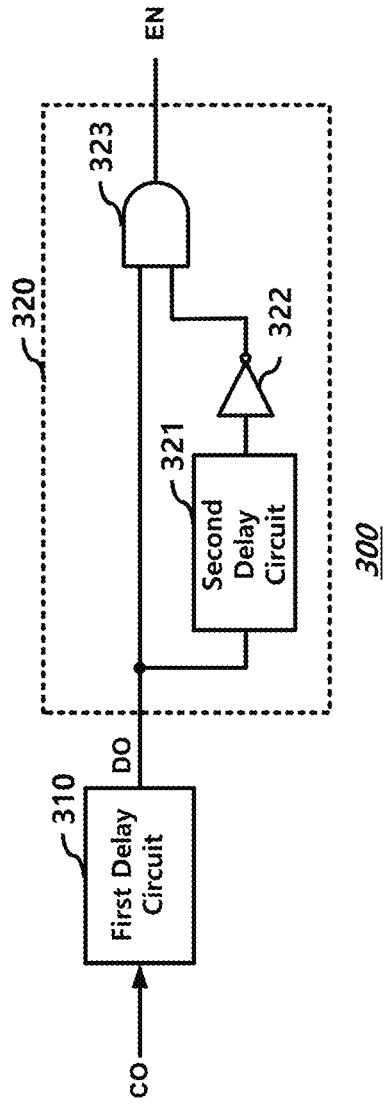
FIGS. 3A and 3B respectively illustrate a sample signal generating circuit according to an embodiment and an operation thereof.
Figure 3B:
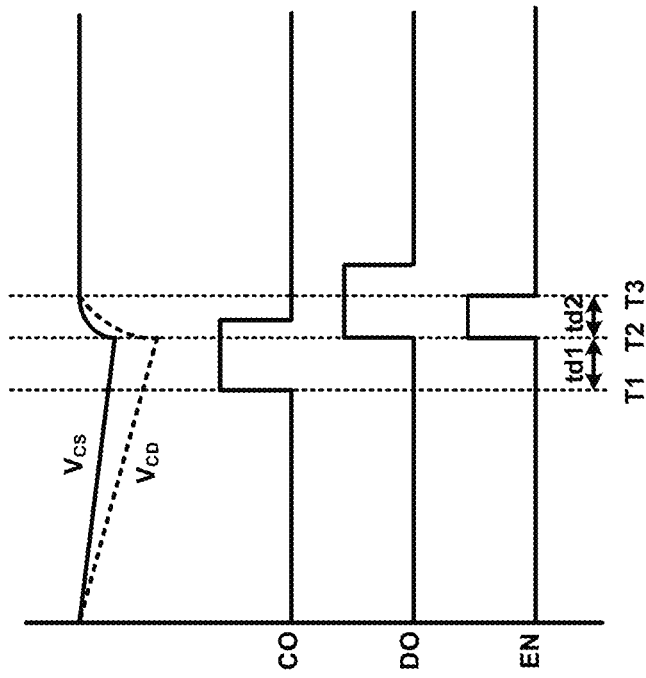

FIG. 3A illustrates a sample signal generating circuit and FIG. 3B illustrates an operation thereof according to an embodiment of the present disclosure.

In this embodiment, the sample signal generating circuit 300 includes a first delay circuit 310 and a pulse generating circuit 320 as shown in FIG. 3A.

The pulse generating circuit 320 includes a second delay circuit 321 for delaying a delay signal DO output from the first delay circuit 310, an inverter 322 for inverting the output of the second delay circuit 321, and an AND gate 323 for performing AND operation on the output of the inverter 322 and the delay signal DO to output the sample signal EN.

FIG. 3B illustrates the operation of the sample signal generating circuit 300.

The voltage of the second node N2, that is, the charge voltage of the first capacitor $C_S$ is denoted by $V_{CS}$, and the voltage of the third node N3, that is, the charge voltage of the second capacitor $C_D$ is denoted by $V_{CD}$.

Initially, both voltages are the same and begin to decrease when charge leakage occurs.

Initially, the output signal CO of the comparing circuit 200 maintains a low level.

Thereafter, when the difference between the two voltages exceeds the threshold value at a first time T1, the output of the comparing circuit 200 transitions to a high level.

The output signal CO of the comparing circuit 200 is delayed by the first duration td1 while passing through the first delay circuit 310 io and the delay signal DO output from the first delay circuit 310 transitions to a high level at a second time T2.

The sample signal EN also transitions to a high level at the second time T2. At this time, the BGR circuit 10, the first switch SW1 and the second switch SW2 are turned on and the first capacitor $C_S$ and the second capacitor $C_D$ are charged.

As a result, the two voltages become equal again, and the output of the comparing circuit 200 transitions to a low level again after the second time T2.

The sample signal EN transitions to a low level again at a third time T3 when second duration td2, which corresponds to a delay time of the second delay circuit 321, has elapsed since the second time T2.

The delay time of the second delay circuit 321 can be adjusted so that the first capacitor $C_S$ and the second capacitor $C_D$ can be sufficiently charged in a period in which the sample signal EN is at a high level.

According to the embodiment, the first delay circuit 310 can be omitted. Then, the sample signal EN becomes a high level at T1 when the comparison signal CO transitions to a high level.

According to another embodiment, the output CO of the comparing circuit 200 can be used as the sample signal EN as it is. In this case, the sample signal generating circuit 300 can be omitted.

Returning to FIG. 1, the reference current generating circuit 400 generates a reference current.

Each of the comparing circuit 200 and the sample signal generating circuit 300 may generate a bias current by mirroring the reference current generated in the reference current generating circuit 400.

Generally, a separate reference voltage generating circuit can be used to generate the reference current, but this increases the circuit area and increases the power consumption.

In order to prevent this, a reference current is generated using the low power reference voltage $V_{BGS}$ provided from the first capacitor $C_S$ in the present disclosure.

Figure 4:
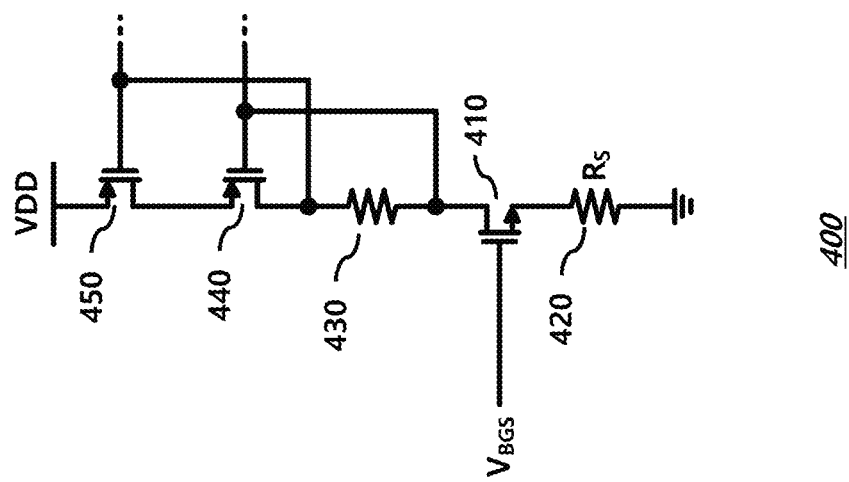
FIG. 4 illustrates a reference current generating circuit according to an embodiment.

FIG. 4 illustrates a reference current generating circuit 400 according to an embodiment of the present disclosure. In embodiments, the reference current generating circuit 400 may be used to generate, for example, the currents of the first to fourth current source 221 to 224 of the comparing circuit 200 of FIG. 2, currents used in the first and second delay circuits 310 and 321 of the sample signal generating circuit 300 of FIG. 3, or both, but embodiments are not limited thereto.

The reference current generating circuit 400 includes an NMOS transistor 410 receiving the low power reference voltage $V_{BGS}$ at its gate and a resistor 420 coupled between the source of the NMOS transistor 410 and the ground.

The source current of the NMOS transistor 410 may be used as the reference current.

The reference current generating circuit 400 further includes diode-connected PMOS transistors 440 and 450 for use in current mirroring coupled between the drain of the NMOS transistor 410 and the power supply.

The reference current generating circuit 400 may further include a resistor 430 coupled between a drain of the NMOS transistor 410 and a drain of the PMOS transistor 440. The diode-connected PMOS transistors 440 and 450 and the resistor 430 may correspond to the input side of one or more self-biased cascode current mirrors, wherein the output side of each of the self-biased cascode current mirrors comprise first and second output PMOS transistors connected in series to the power supply voltage VDD and having gates respectively connected to the gates of the diode-connected PMOS transistors 440 and 450, in accordance with the related arts.

Since the reference current is determined according to the NMOS transistor 410 operating as a voltage follower to buffer the low power reference voltage $V_{BGS}$ in this embodiment, the reference current is not affected by the power supply voltage VDD.

Since the low power reference voltage $V_{BGS}$ applied to the gate of the NMOS transistor 410 is less influenced by process and temperature variation, the reference current is also less influenced by process and temperature variation.

However, the threshold voltage of the NMOS transistor 410 may vary according to temperature and process variation, but in this embodiment, the resistance 420 may be connected to reduce the influence of the threshold voltage. The larger the resistance Rs of the resistor 420, the less the influence of the threshold voltage.

Figure 5:
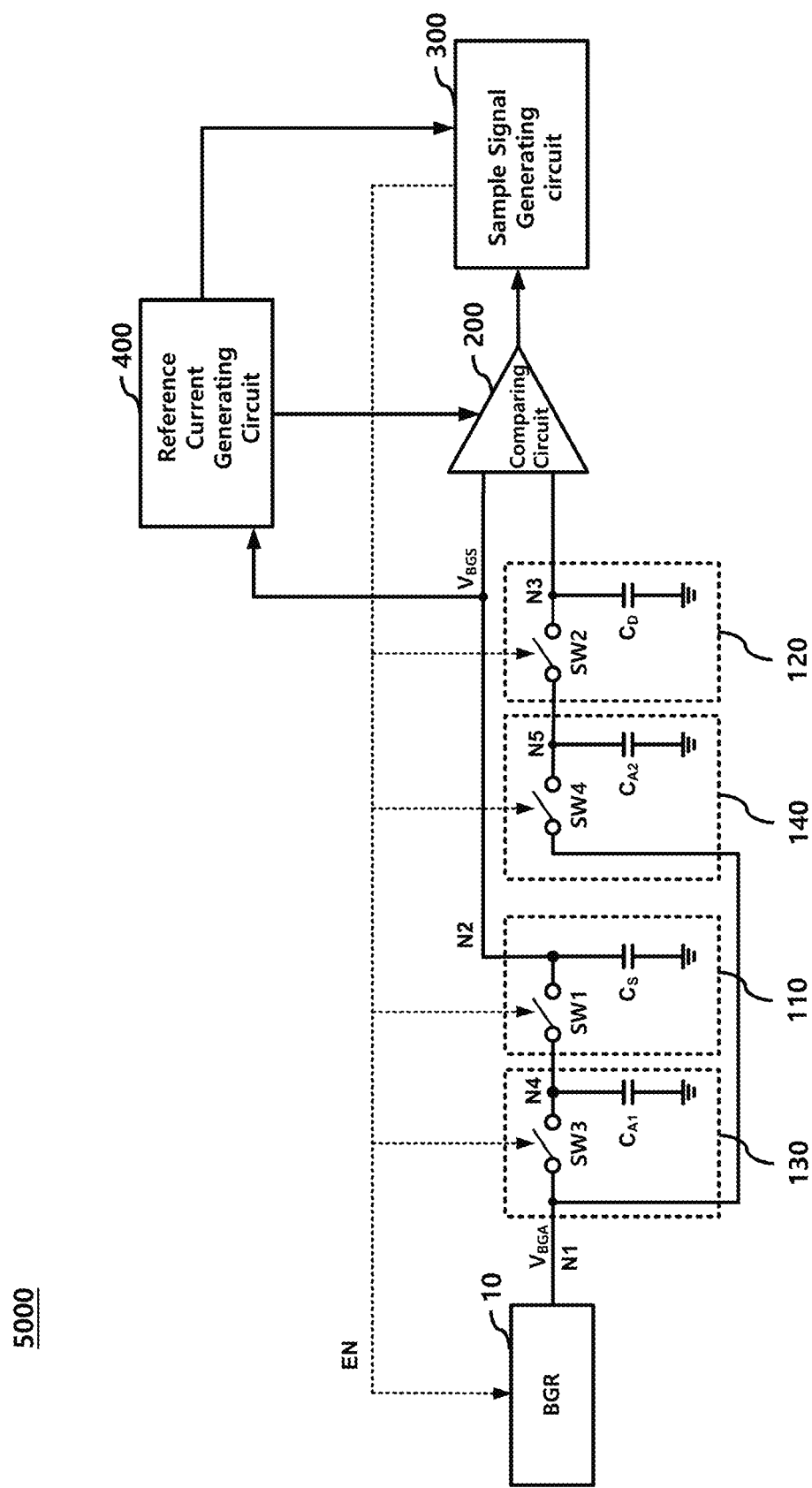
FIGS. 5 and 6 illustrate reference voltage generating circuits according to other embodiments.

FIG. 5 illustrates a reference voltage generating circuit 5000 according to another embodiment of the present disclosure.

The embodiment of FIG. 5 includes additional elements for suppressing variation in the charge amount of the first capacitor $C_S$ and the second capacitor $C_D$ compared with the embodiment of FIG. 1.

The frequency at which the sample signal EN is activated decreases as variation in charge amount of the first capacitor $C_S$ and the second capacitor $C_D$ decreases and accordingly operation time of the BGR circuit 10 to charge the first capacitor $C_S$ and the second capacitor $C_D$ can be reduced and the power consumption can be reduced.

The reference voltage generating circuit 5000 further includes a third charging circuit 130 and a fourth charging circuit 140 in order to suppress variation in charge amount of the first capacitor $C_S$ and the second capacitor $C_D$.

The third charging circuit 130 is connected between the first node N1 and the first switch SW1 and the fourth charging circuit 140 is connected between the first node N1 and the second switch SW2.

The first switch SW1 and the second switch SW2 may be generally implemented as respective MOS transistors. In this embodiment, it is assumed that the first switch SW1 and the second switch SW2 are implemented by NMOS transistors having drains respectively connected to the first capacitor $C_S$ and the second capacitor $C_D$.

Even if these switches are turned off, charge amount of the first capacitor $C_S$ and the second capacitor $C_D$ may fluctuate due to leakage current flowing in sub-threshold region of the MOS transistors.

At this time, for example, the charge amount of the first capacitor $C_S$ may increase or decrease depending on the direction of a leakage current through the first switch SW1.

The magnitude of the leakage current is affected by a voltage difference between the gate and the source of the first switch SW1.

When the sample signal EN is inactivated, since the gate voltage is fixed at a low level, it is desirable to maintain the source voltage of the first switch S1 at a high level (for example, at a level similar to the voltage on the first capacitor $C_S$) in order to reduce the leakage current.

The third charging circuit 130 includes a third capacitor $C_{A1}$ connected between the fourth node N4 and the ground and a third io switch SW3 connected between the first node N1 and the fourth node N4.

The third switch SW3 is turned on according to the sample signal EN to charge the third capacitor $C_{A1}$ with the active reference voltage $V_{BGA}$.

When the sample signal EN is inactivated, the third capacitor $C_{A1}$ maintains a positive voltage to increase the source voltage of the first switch SW1, thereby reducing leakage current in the first switch SW1.

The fourth charging circuit 140 includes fourth capacitor $C_{A2}$ connected between the fifth node N5 and ground and a fourth switch SW4 connected between the first node N1 and the fifth node N5.

The fourth charging circuit 140 operates in the same manner as the third charging circuit 130 to reduce leakage current of the second capacitor $C_D$.

Figure 6:
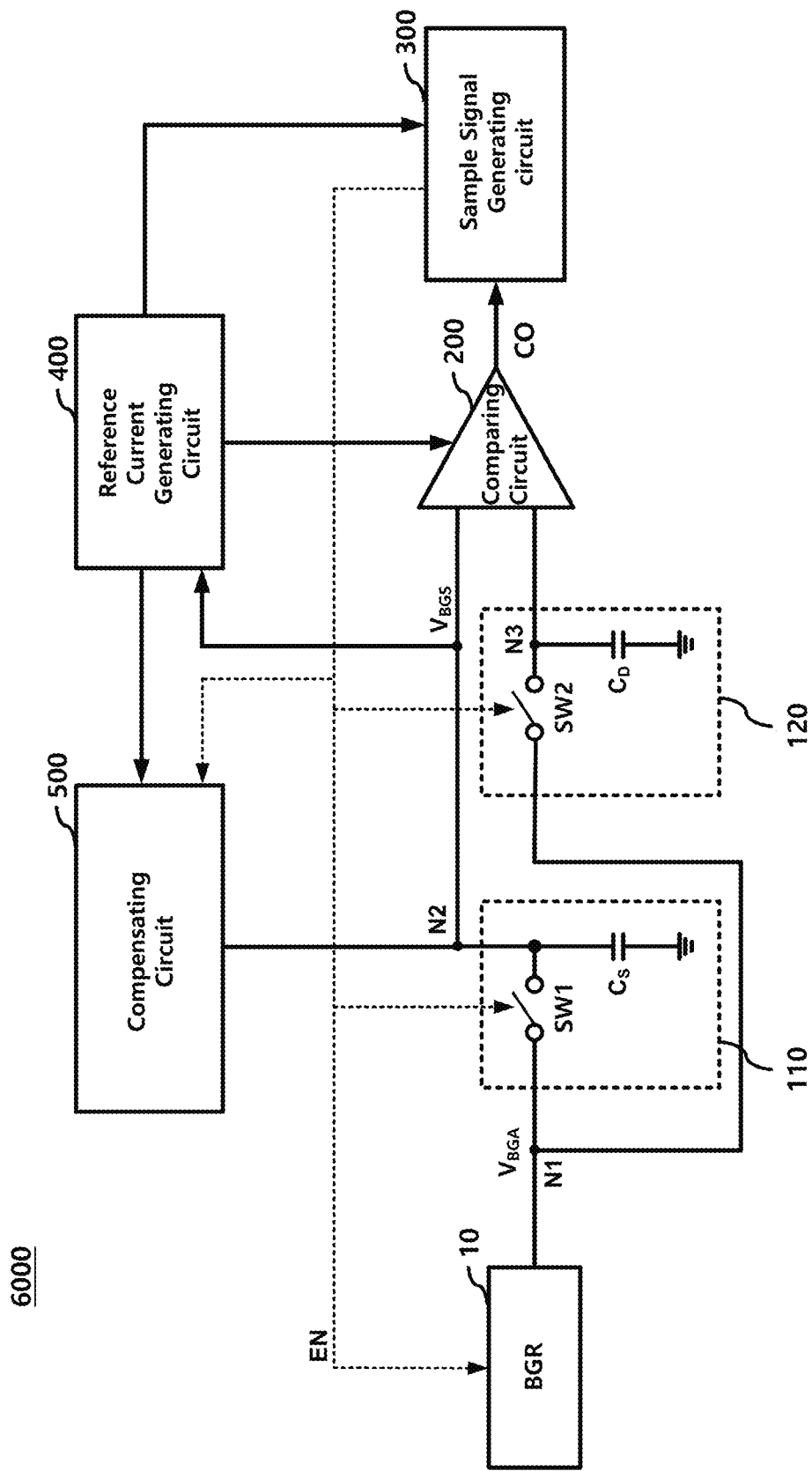

FIG. 6 illustrates a reference voltage generating circuit 6000 according to another embodiment of the present disclosure.

The embodiment of FIG. 6 additionally comprises a compensating circuit 500 for compensating variation in charge of the first capacitor $C_S$.

For example, if charge amount of the first capacitor $C_S$ is reduced due to leakage, the compensating circuit 500 supplies charge to the first capacitor $C_S$ to maintain the charge amount of the first capacitor $C_S$. If charge amount of the first capacitor $C_S$ increases, the compensating circuit 500 leaks charge from the first capacitor $C_S$ to maintain the charge amount of the first capacitor $C_S$.

This keeps the low power reference voltage $N_{BGS}$ constant.

The compensating circuit 500 senses and compensates for a change in charge amount of the first capacitor $C_S$. According to embodiments, a circuit for compensating for variation in the charge amount of the second capacitor $C_D$ may also be provided, with a corresponding increase in the area of the circuit.

The compensating circuit 500 may generate a bias current by mirroring the reference current generated by the reference current generating circuit 400 and operate using the bias current.

Figure 7:
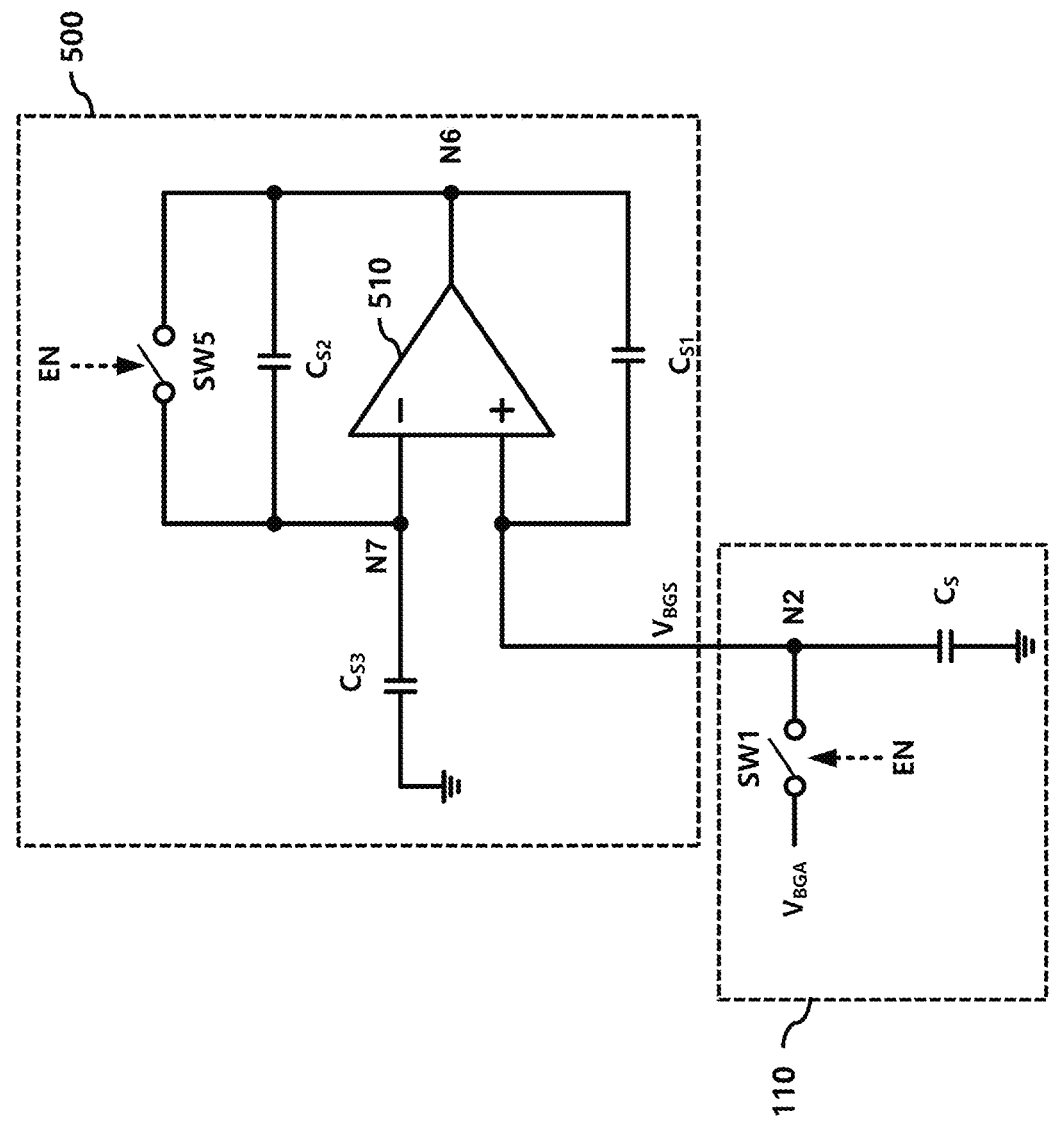
FIG. 7 illustrates a compensating circuit according to an embodiment.

FIG. 7 illustrates a compensating circuit 500 according to an embodiment of the present disclosure.

The compensating circuit 500 includes an operational amplifier 510 that amplifies a voltage difference between a second node N2 and a seventh node N7. The operational amplifier 510 may operate using a bias current generated using the reference current generating circuit 400.

The second node N2 is coupled to the positive input terminal (+) of the operational amplifier 510 and the seventh node N7 is coupled to the negative input terminal (−) of the operational amplifier 510.

A sixth node N6 is the output node of the operational amplifier 510. A first compensation capacitor $C_{S1}$ is coupled between the sixth node N6 and the second node N2, and a second compensation capacitor $C_{S2}$ is coupled between the sixth node N6 and the seventh node N7. The is first compensation capacitor $C_{S1}$ and the second compensation capacitor $C_{S2}$ have the same capacitance C1.

A third compensation capacitor $C_{S3}$ is coupled between the seventh node N7 and the ground. A voltage at the seventh node N7 corresponds to a comparison voltage.

The capacitance of the third compensation capacitor $C_{S3}$ is set to be smaller than the capacitance of the first capacitor $C_S$.

The compensating circuit 500 keeps the low power reference voltage $V_{BGS}$ output from the second node N2 constant.

When the low power reference voltage $V_{BGS}$ is reduced due to leakage of the first capacitor $C_S$, leakage also occurs at the third compensation capacitor $C_{S3}$. But the voltage of the seventh node N7 decreases more than that of the second node N2 because of the difference in capacitance.

Accordingly, the voltage at the sixth node N6 increases, charge is supplied from the sixth node N6 through the first and second compensation capacitors $C_{S1}$ and $C_{S2}$, and the first capacitor $C_S$ and the third compensation capacitor $C_{S3}$ are charged thereby.

Here, the capacitance C1 of the first and second compensation capacitors $C_{S1}$ and $C_{S2}$ is set to be much smaller than the capacitance of the third compensation capacitor $C_{S3}$.

As a result, when viewed from the output node N6 of the operational amplifier 510, the impedance of a path in the direction of the second node N2 becomes similar to that of a path in the direction of the seventh node N7, and amount of charge transferred to the capacitor $C_S$ becomes similar to that transferred to the third compensation capacitor $C_{S3}$.

Accordingly, the compensating circuit 500 performs a stable feedback operation, so that the voltage of the second node N2, that is, the low power reference voltage $V_{BGS}$, can be kept constant.

The compensating circuit 500 further includes a fifth switch SW5 that is turned on when the sample signal EN is activated.

Accordingly, when the sample signal EN is activated, the second compensation capacitor $C_{S2}$ is completely discharged by coupling together both terminals of the second compensation capacitor $C_{S2}$.

When the sample signal EN is activated, the voltage of the second node N2 is charged through a first switch SW1 to the active reference voltage $V_{BGA}$, the fifth switch SW5 is turned on, voltages of the sixth node N6 and the seventh node N7 become the same, and the io voltage of the seventh node N7 becomes equal to the voltage of the second node N2 by feedback operation of the operational amplifier 510.

Accordingly, when the sample signal EN is activated, the first compensation capacitor $C_{S1}$ is discharged.

The voltage of the sixth node N6 may be saturated with the power supply voltage supplied to the operational amplifier 510. When the first compensation capacitor $C_{S1}$ and the second compensation capacitor $C_{S2}$ are charged, the operation to compensate charge of the first capacitor $C_S$ is limited.

Therefore, it may be advantageous to discharge the first compensation capacitor $C_{S1}$ and the second compensation capacitor $C_{S2}$ when the sample signal EN is activated.

In the embodiment of FIG. 6, the charge compensation may be insufficient when the output voltage of the operational amplifier 510 provided at the sixth node N6 is saturated.

To prepare for the insufficient compensation at the embodiment of FIG. 6, the voltage difference between the first capacitor $C_S$ and the second capacitor $C_D$ may be sensed, and the voltage of the first capacitor $C_S$ and the voltage of the second capacitor $C_D$ may be initialized to the active reference voltage $V_{BGA}$ as disclosed in FIG. 1.

Those skilled in the art will readily be able to derive other embodiments by combining the embodiments disclosed in FIGS. 1, 5, and 6.

For example, an embodiment in which the compensating circuit 500 of FIG. 6 is added to the reference voltage generating circuit 6000 of FIG. 5 may be derived.

Figure 8:
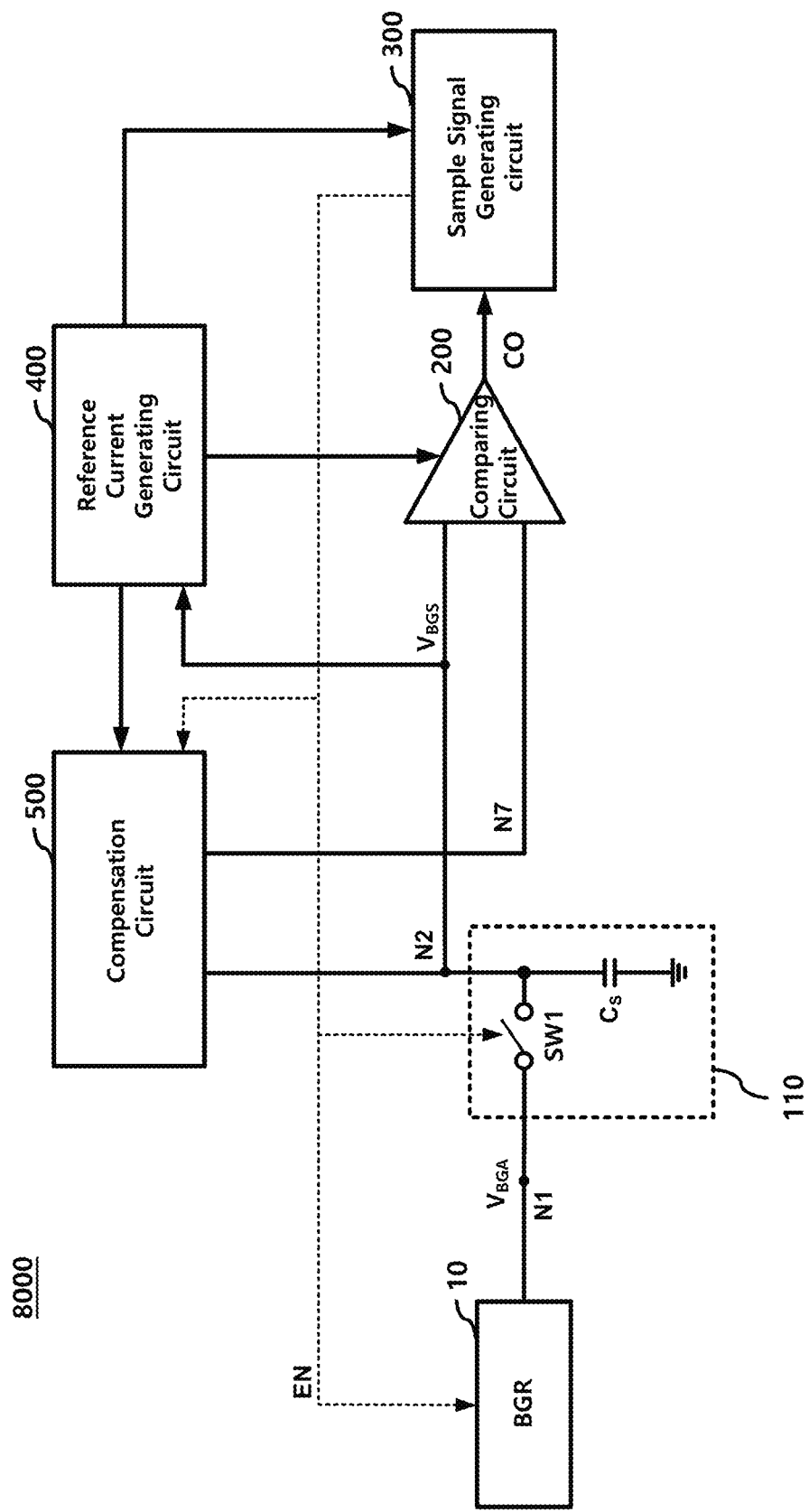
FIG. 8 illustrates a reference voltage generating circuit according to another embodiment.

FIG. 8 illustrates a reference voltage generating circuit 8000 according to another embodiment of the present disclosure.

In FIG. 8, the comparing circuit 200 compares the voltages of the second node N2 and the seventh node N7 of the compensating circuit 500. Thus, the second charging circuit 120 of FIG. 1 may be omitted.

The charge compensation operation is performed so that voltage at the seventh node N7 and voltage at the second node N2 are maintained at the same voltage by the feedback operation of the operational amplifier 510 as shown in FIG. 7.

However, charge compensation may be insufficient due to saturation of the output voltage of the operational amplifier 510 provided at the sixth node N6. As a result, a voltage difference may occur between the second node N2 and the seventh node N7.

When this occurs, the voltage of the second node N2 and the voltage of the seventh node N7 can be initialized to the active reference voltage $V_{BGA}$ by activating the sample signal EN.

Accordingly, in the embodiment of FIG. 8, it is not necessary to io separately track the voltage difference between the first capacitor $C_S$ and the second capacitor $C_D$ of FIG. 1 and thus the second charging circuit 120 may be omitted.

Since the operation of the other elements are the same as described above, a detailed description thereof will be omitted.

Although various embodiments have been described for illustrative purposes, various changes and modifications may be possible.

What is claimed is:

1. A reference voltage generating circuit comprising:
a bandgap reference (BGR) circuit configured to output an active reference voltage at a first node according to a sample signal;
a first charging circuit configured to charge a first capacitor using the active reference voltage according to the sample signal;
a second charging circuit configured to charge a second capacitor using the active reference voltage according to the sample signal;
a comparing circuit configured to compare a voltage difference between a charge voltage of the first capacitor and a charge voltage of the second capacitor with a threshold value; and
a reference current generating circuit configured to generate a reference current from a low power reference voltage,
wherein the comparing circuit operates using the reference current, and
wherein the sample signal is a pulse signal generated using an output of the comparing circuit and the charge voltage of the first capacitor is provided as the low power reference voltage in a low power operation mode.

2. The reference voltage generating circuit of claim 1, wherein the BGR circuit is always turned on in a normal operation mode, is intermittently turned on in the low power operation mode according to the sample signal, and provides the active reference voltage in response to being turned on.

3. The reference voltage generating circuit of claim 1, wherein capacitance of the second capacitor is less than capacitance of the first capacitor.

4. The reference voltage generating circuit of claim 1, further comprising a sample signal generating circuit including:
a pulse signal generating circuit configured to output a pulse signal having a predetermined width in synchronization with an output of the comparing circuit,
wherein the predetermined width is long enough to charge the first capacitor to the low power reference voltage.

5. The reference voltage generating circuit of claim 4, wherein the sample signal generating circuit further comprises a delay circuit to delay an output signal of the comparing circuit and to output a signal to be provided to the pulse signal generating circuit.

6. The reference voltage generating circuit of claim 1, wherein the comparing circuit comprises:
a first input transistor including a gate to receive charge voltage of the first capacitor;
a second input transistor including a gate to receive charge voltage of the second capacitor;
a third input transistor including a gate to receive charge voltage of the first capacitor;
a fourth input transistor including a gate to receive charge voltage of the second capacitor;
a first current source coupled to a source of the first input transistor and a source of the second input transistor;
a second current source coupled to a source of the third input transistor and a source of the fourth input transistor;
a third current source coupled to a drain of the second input transistor and a drain of the third input transistor; and
an output circuit to output a signal whose voltage is controlled by a drain voltage of the second input transistor.

7. The reference voltage generating circuit of claim 6, wherein a ratio of sizes of the first input transistor and the second input transistor is reverse of a ratio of sizes of the third input transistor and the fourth input transistor and the first input transistor and the second input transistor have different sizes.

8. The reference voltage generating circuit of claim 7, wherein the threshold value is determined according to ratio of sizes of the first input transistor and the second input transistor.

9. The reference voltage generating circuit of claim 6, wherein the output circuit includes a transistor having a gate coupled to a drain of the second input transistor and a drain coupled to an output node; and a fourth current source coupled to the output node.

10. The reference voltage generating circuit of claim 1, wherein the reference current generating circuit comprises:
an NMOS transistor including a gate receiving the low power reference voltage;
a resistor coupled between a source of the NMOS transistor and ground; and
a diode-connected PMOS transistor including a source coupled to a power source and a drain and a gate commonly coupled to a drain of the NMOS transistor.

11. The reference voltage generating circuit of claim 10, wherein the reference current generating circuit further comprises a resistor coupled between a drain of the diode-connected PMOS transistor and a drain of the NMOS transistor.

12. The reference voltage generating circuit of claim 1, further comprising a compensating circuit to control a charge amount of the first capacitor to be constant.

13. The reference voltage generating circuit of claim 12, wherein the compensating circuit comprises:
an amplifier including an output terminal, a negative input terminal, and a positive input terminal, wherein the positive input terminal is coupled to the first capacitor and receives the low power reference voltage;
a first compensation capacitor coupled between the output terminal and the positive input terminal;
a second compensation capacitor coupled between the output terminal and the negative input terminal; and
a third compensation capacitor coupled between the negative input terminal and ground.

14. The reference voltage generating circuit of claim 13, wherein a capacitance of the third compensation capacitor is less than a capacitance of the first capacitor, a capacitance of the first compensation capacitor is as same as a capacitance of the second compensation capacitor and the capacitance of the first compensation capacitor is less than capacitance of the third compensation capacitor.

15. The reference voltage generating circuit of claim 13, further comprising a switch coupled in parallel to the second compensation capacitor and turned on in response to the sample signal being activated.

16. A reference voltage generating circuit comprising:
a bandgap reference (BGR) circuit configured to output an active reference voltage at a first node according to a sample signal;

a first charging circuit configured to charge a first capacitor using the active reference voltage according to the sample signal;

a second charging circuit configured to charge a second capacitor using the active reference voltage according to the sample signal;

a third charging unit;

a fourth charging unit; and a comparing circuit configured to compare a voltage difference between a charge voltage of the first capacitor and a charge voltage of the second capacitor with a threshold value, wherein the sample signal is a pulse signal generated using an output of the comparing circuit and the charge voltage of the first capacitor is provided as a low power reference voltage in a low power operation mode, wherein the first charging circuit includes a first switch connecting the first node and the first capacitor according to the sample signal; and the second charging circuit connecting the first node and the second capacitor according to the sample signal, wherein the third charging circuit is configured to provide a first positive voltage to a first terminal of the first switch when the first switch is turned off, and wherein the fourth charging circuit is configured to provide a second positive voltage to a first terminal of the second switch when the second switch is turned off.

17. The reference voltage generating circuit of claim 16, wherein the third charging circuit includes a third capacitor connected to the first terminal of the first switch and the fourth charging circuit includes a fourth capacitor connected to the first terminal of the second switch.

18. The reference voltage generating circuit of claim 17, wherein the third charging circuit includes a third switch coupling the first node and the third capacitor according to the sample signal and the fourth charging circuit includes a fourth switch coupling the first node and the fourth capacitor according to the sample signal.

19. A reference voltage generating circuit comprising:

a bandgap reference (BGR) circuit configured to output an active reference voltage at a first node according to a sample signal;

a first charging circuit configured to charge a first capacitor using the active reference voltage according to the sample signal;

a compensating circuit configured to keep a charge amount of the first capacitor constant, the compensating circuit including an amplifier receiving the charge voltage of the first capacitor and a comparison voltage;

a comparing circuit configured to compare a voltage difference between the charge voltage of the first capacitor and the comparison voltage to a threshold value; and a reference current generating circuit configured to generate a reference current from a low power reference voltage, wherein the comparing circuit operates using the reference current, and wherein the sample signal is a pulse signal generated from an output of the comparing circuit and the charge voltage of the first capacitor is provided as the low power reference voltage in a low power operation mode.

20. The reference voltage generating circuit of claim 19, wherein the amplifier comprises an output terminal, a negative input terminal, and a positive input terminal, the positive terminal coupled to the first capacitor and receiving the low power reference voltage, and wherein the compensating circuit includes a first compensation capacitor coupled between the output terminal and the positive input terminal; a second compensation capacitor coupled between the output terminal and the negative input terminal; and a third compensation capacitor coupled between the negative input terminal and ground.

21. The reference voltage generating circuit of claim 20, wherein a capacitance of the third compensation capacitor is less than a capacitance of the first capacitor, a capacitance of the first compensation capacitor is as same as a capacitance of the second compensation capacitor, and the capacitance of the first compensation capacitor is less than the capacitance of the third compensation capacitor.

22. The reference voltage generating circuit of claim 20, further comprising a switch coupled in parallel to the second compensation capacitor and turned on in response to the sample signal being activated.

* * * * *